United States Patent
de Bock et al.

(10) Patent No.: US 11,224,098 B2
(45) Date of Patent: Jan. 11, 2022

(54) SYSTEMS AND METHODS FOR PASSIVE HEATING OF TEMPERATURE-SENSITIVE ELECTRONIC COMPONENTS

(71) Applicant: General Electric Company, Schenectady, NY (US)

(72) Inventors: Hendrik Pieter Jacobus de Bock, Clifton Park, NY (US); Darrall John Hicks, Cheltenham (GB); William Dwight Gerstler, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 273 days.

(21) Appl. No.: 16/177,996

(22) Filed: Nov. 1, 2018

(65) Prior Publication Data

US 2020/0146112 A1    May 7, 2020

(51) Int. Cl.
*H05B 1/02* (2006.01)
*H02H 3/16* (2006.01)
(Continued)

(52) U.S. Cl.
CPC .............. *H05B 1/0236* (2013.01); *H02H 3/16* (2013.01); *H05K 7/20* (2013.01); *H02H 3/04* (2013.01);
(Continued)

(58) Field of Classification Search
None
See application file for complete search history.

(56) References Cited

U.S. PATENT DOCUMENTS 3,444,399 A * 5/1969 Jones ..................... G05D 23/24
                                                         307/117
3,584,189 A * 6/1971 Marcoux .............. H05K 7/1092
                                                         219/209
(Continued)

FOREIGN PATENT DOCUMENTS

CN          101592101 A        12/2009
CN          104791889 A         7/2015
(Continued)

OTHER PUBLICATIONS

Extended EP Search Report, dated Feb. 13, 2020, for related EP patent application No. EP 19206173.7 ( 7 pgs.).
(Continued)

*Primary Examiner* — Thor S Campbell
(74) *Attorney, Agent, or Firm* — McGarry Bair PC (57) ABSTRACT

A system configured for operation below a threshold temperature system includes a power supply, a housing, a temperature-sensitive electronic component, and a heating circuit. The temperature-sensitive electronic component is enclosed within said housing and electrically connected to the power supply, wherein the temperature-sensitive electronic component becomes susceptible to failure when the temperature of said temperature-sensitive electronic component decreases and crosses the threshold temperature. The heating circuit is at least partially enclosed within the housing and comprising a temperature-dependent resistor, the heating circuit electrically connected to the power supply and configured to generate heat energy within the housing when the temperature within the housing decreases and approaches the threshold temperature in order to maintain the temperature of the temperature-sensitive electronic component above the threshold temperature.

19 Claims, 5 Drawing Sheets

(51) Int. Cl.
*H05K 7/20* (2006.01)
*H02H 3/04* (2006.01)

(52) U.S. Cl.
CPC .... *H05B 2203/019* (2013.01); *H05B 2203/02* (2013.01)

(56) References Cited

U.S. PATENT DOCUMENTS

| | | | |
|---|---|---|---|
| 3,737,622 A | 6/1973 | Hallgreen | |
| 4,093,355 A * | 6/1978 | Kaplit | G02F 1/133382 219/209 |
| 4,104,509 A * | 8/1978 | Van Bokestal | H01C 1/02 219/544 |
| 4,374,316 A * | 2/1983 | Inamori | H01L 23/345 219/209 |
| 4,481,403 A * | 11/1984 | Del Monte | B23K 1/0004 219/209 |
| 4,518,944 A * | 5/1985 | Faris | H03H 9/08 310/343 |
| 5,010,233 A * | 4/1991 | Henschen | B23K 3/0475 219/209 |
| 5,088,645 A | 2/1992 | Bell | |
| 5,177,341 A * | 1/1993 | Balderson | H05B 3/26 219/543 |
| RE34,179 E * | 2/1993 | Eccleston | H01L 25/167 257/467 |
| 5,268,558 A * | 12/1993 | Youssef | H05B 3/26 219/209 |
| 5,288,974 A * | 2/1994 | Hanzic | A47C 7/748 219/501 |
| 5,420,397 A * | 5/1995 | Weiss | G05D 23/2401 219/492 |
| 5,486,681 A * | 1/1996 | Dagnac | H05K 7/20 219/385 |
| 5,592,647 A | 1/1997 | Yamauchi et al. | |
| 6,114,674 A * | 9/2000 | Baugh | H01C 13/00 174/250 |
| 6,262,392 B1 * | 7/2001 | Morton | H05B 3/00 219/209 |
| 6,393,213 B1 * | 5/2002 | Bresolin | A01K 63/065 219/538 |
| 6,423,940 B1 * | 7/2002 | Schupbach | G05D 23/1919 219/209 |
| 6,621,055 B2 * | 9/2003 | Weber | H05B 3/26 219/494 |
| 6,667,461 B1 * | 12/2003 | Cogan | H02H 9/026 219/209 |
| 6,676,027 B1 | 1/2004 | Noordmans et al. | |
| 6,781,056 B1 * | 8/2004 | O'Rourke | H05K 1/0212 174/255 |
| 6,938,815 B2 | 9/2005 | Li | |
| 6,958,463 B1 * | 10/2005 | Kochman | H05B 3/56 219/494 |
| 7,335,855 B2 * | 2/2008 | von der Luhe | H01C 1/014 219/201 |
| 8,692,349 B2 * | 4/2014 | Kim | H01L 23/34 257/467 |
| 8,981,259 B2 * | 3/2015 | Chou | H05B 3/26 219/209 |
| 9,693,446 B2 * | 6/2017 | Ragg | H05K 1/0212 |
| 9,980,365 B1 * | 5/2018 | Chen | H05K 1/18 |
| 10,368,394 B2 * | 7/2019 | Shearer | H05B 1/02 |
| 2003/0089700 A1 * | 5/2003 | Chang | H05B 1/0252 219/505 |
| 2006/0065653 A1 * | 3/2006 | Weber | H01C 7/02 219/505 |
| 2006/0180583 A1 * | 8/2006 | Jones | H05B 1/0236 219/202 |
| 2006/0289464 A1 | 12/2006 | von der Luhe et al. | |
| 2011/0172750 A1 | 7/2011 | Cassidy et al. | |
| 2012/0125333 A1 * | 5/2012 | Bedford | A61M 16/06 128/203.25 |
| 2012/0217233 A1 * | 8/2012 | Base | H05B 3/44 219/534 |
| 2013/0105455 A1 * | 5/2013 | Huang | H05B 3/24 219/201 |

FOREIGN PATENT DOCUMENTS

| | | |
|---|---|---|
| CN | 107124775 A | 9/2017 |
| EP | 0949857 A2 | 10/1999 |

OTHER PUBLICATIONS

Cahill et al., "Self-Controlled Variable Resistance Heating System", IEEE Transactions on Industry Applications, vol. IA-11, Issue: 3, pp. 314-318, May 1975.

European Patent Office, Communication pursuant to Article 94(3) EPC re Corresponding Application No. 19206173.7-1202, dated Dec. 16, 2020, 5 pages, Munich, Germany.

Chinese Patent Office, Office Action re Corresponding Application No. 201911054637.8, dated Jan. 12, 2021, 11 pages, China.

* cited by examiner

SYSTEMS AND METHODS FOR PASSIVE HEATING OF TEMPERATURE-SENSITIVE ELECTRONIC COMPONENTS

BACKGROUND

The subject matter disclosed herein relates generally to systems and methods for passively heating temperature-sensitive electronic components, and, more particularly, to systems and methods for passively maintaining a temperature of one or more electronic components above a minimum operating temperature during cold temperature operation.

Many aerospace and terrestrial systems incorporate a variety of complex internal electronic systems, such as, for example, guidance systems, navigation systems, power systems, and the like. During operation, these systems may be subjected to a variety of environmental extremes, such as, for example, extreme high and low temperatures and/or rapid fluctuations in a variety of environmental conditions, such as temperature, humidity, and pressure.

As a result, many conventional aerospace and terrestrial systems may include one or more environmental control systems arranged to protect sensitive internal electronic hardware and circuitry from surrounding environmental conditions. Commonly, however, these environmental control systems require additional environmental shielding and/or control systems of their own. In addition, many conventional environmental control systems are themselves quite complex and may require substantial time and financial expenditure for their design and implementation. An additional drawback is that such systems may, as a result of their complexity, fail unexpectedly and/or require periodic maintenance.

For instance, many aerospace systems are designed for high altitude cold temperature operation. However, certain electronic components, such as one or more off-the-shelf microprocessors, may require a temperature-controlled internal environment for proper operation. To this end, a typical aerospace system may include a stand-alone environmental control system, which may itself rely upon temperature measurements and/or calculations obtained by and/or processed by one or more dedicated electronic components (e.g., temperature sensors, microcontrollers, etc.)

BRIEF DESCRIPTION

In one aspect, a system configured for operation below a threshold temperature is provided. The system includes a power supply, a housing, a temperature-sensitive electronic component, and a heating circuit. The temperature-sensitive electronic component is enclosed within the housing and electrically connected to the power supply, the temperature-sensitive electronic component becomes susceptible to failure when the temperature of the temperature-sensitive electronic component decreases and crosses the threshold temperature. The heating circuit is at least partially enclosed within the housing and comprises a temperature-dependent resistor, the heating circuit electrically connected to the power supply and configured to generate heat energy within the housing when the temperature within the housing decreases and approaches the threshold temperature in order to maintain the temperature of the temperature-sensitive electronic component above the threshold temperature.

In another aspect, a system configured for operation below a threshold temperature is provided. The system includes at least one temperature-sensitive electronic component and at least one passive resistive heating element. The at least one temperature-sensitive electronic component becoming susceptible to failure when the temperature of the at least one temperature-sensitive electronic component decreases and crosses the threshold temperature. The at least one passive resistive heating element configured to generate heat energy when an ambient temperature of the at least one passive resistive heating element decreases and approaches the threshold temperature the threshold temperature in order to maintain the temperature of the at least one temperature-sensitive electronic component above the threshold temperature.

In yet another aspect, a heating circuit for heating a temperature-sensitive electronic component is provided, the temperature-sensitive electronic component becoming susceptible to failure when the temperature of the temperature-sensitive electronic component decreases and crosses a threshold temperature. The heating circuit includes a power source, a temperature-dependent resistor electrically connected to the power source, the temperature-dependent resistor configured to decrease in resistance when the temperature surrounding the temperature-dependent resistor decreases and approaches the threshold temperature. The heating circuit further includes a resistive heating element electrically connected in series with the temperature-dependent resistor and configured to generate heat energy when the temperature-dependent resistor decreases in resistance in order to maintain the temperature of the temperature-sensitive electronic component above the threshold temperature. The heating circuit further includes a current monitor configured to sense a current through the temperature-dependent resistor and indicate, based on the sensed current, at least one of a sensed open-circuit failure and short circuit failure.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

As used herein, the phrase "generate heat energy" means that generator produces at least 0.1 watts of heat energy.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, other computer peripherals may also be used that may include, for example, but not be limited to, a scanner. Furthermore, in the exemplary embodiment, additional output channels may include, but not be limited to, an operator interface monitor.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Exemplary embodiments of passive heating systems and methods are described herein. The exemplary passive heating systems described herein include a housing and a temperature-sensitive electronic component enclosed within the housing. The temperature-sensitive electronic component is electrically connected to a power supply. The temperature-sensitive electronic component is designed for reliable operation above a threshold temperature. Specifically, the temperature-sensitive electronic component is susceptible to failure at an increased rate when the electronic component is operated below the threshold temperature. The passive heating system further includes a heating circuit at least partially enclosed within the housing. The heating circuit includes a temperature-dependent resistor electrically connected to the power supply. The heating circuit is configured to generate heat energy within the housing when the temperature within the housing decreases and approaches the threshold temperature in order to maintain the temperature of the temperature-sensitive electronic component above the threshold temperature.

Figure 1:
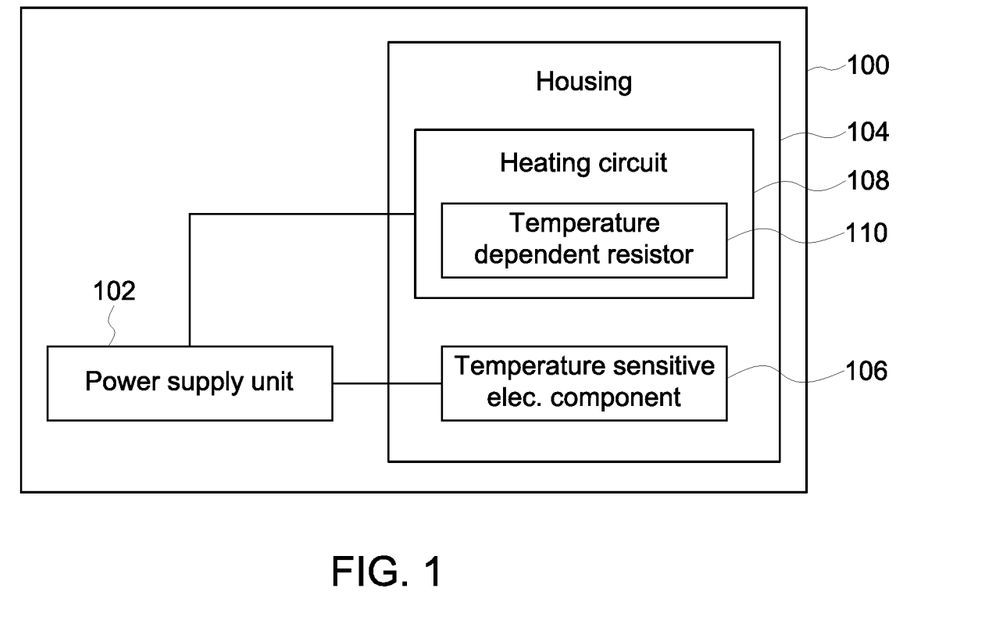
FIG. 1 is a block diagram of an exemplary passive heating system.

FIG. 1 is a block diagram of an exemplary passive heating system 100. Passive heating system 100 includes a power supply unit 102, a housing 104, and a temperature-sensitive electronic component 106 enclosed within housing 104. In the exemplary embodiment, temperature-sensitive electronic component 106 is an electronic component for use in an onboard computing system of an aerospace device or vehicle. For example, temperature-sensitive electronic component 106 may be an electronic component in a remote interface unit (RIU) system of an aerospace device or vehicle. More specifically, in the exemplary embodiment, temperature-sensitive electronic component 106 is a microprocessor for use in a RIU system. In alternative embodiments, temperature-sensitive electronic component 106 may be individual electronic components included in a microprocessor of an RIU system. In even further embodiments, temperature-sensitive electronic component 106 is any electronic component that enables passive heating system 100 to function as described herein.

In the exemplary embodiment, temperature-sensitive component 106 is electrically connected to power supply 102. Temperature-sensitive electronic component 106 is configured for operation above a threshold temperature. In particular, temperature-sensitive electronic component 106 is configured to consistently and reliably operate above a manufacturer-specified threshold temperature. Accordingly, temperature-sensitive electronic component 106 is susceptible to a higher probability of failure when operating in an environment having an ambient temperature below the threshold temperature.

Passive heating system 100 further includes a heating circuit 108 including a temperature-dependent resistor, such as a thermistor 110, enclosed within housing 104 and electrically connected to power supply unit 102. In the exemplary embodiment, power supply unit 102 is located outside of housing 104. In alternative embodiments, power supply unit 102 is located within housing 104. In the exemplary embodiment, power supply unit 102 supplies direct current (DC) power to heating circuit 108 and temperature-sensitive component 106. In alternative embodiments, power supply unit 102 includes any voltage source that enables passive heating system 100 to function as described herein. For example, in alternative embodiments, power supply unit 102 includes multiple voltage sources such as 5 Volt, 12 Volt, and 28 Volt buses configured to provide direct current power. In such embodiments, heating circuit 108 is electrically coupled to the 12 Volt bus and temperature-sensitive electronic component 106 is electrically coupled to the 28 Volt bus. In other embodiments, heating circuit 108 is configured to be electrically coupled to any power supply that enables passive heating system 100 to function as described herein. In alternative embodiments, heating circuit 108 is connected to a different power supply unit 102 than temperature-sensitive electronic component 106.

In the exemplary embodiment, housing 104 encloses heating circuit 108 and temperature-sensitive electronic component 106 such that heat radiated by heating circuit 108 is at least partially captured and contained within housing 104 to facilitate heating of temperature-sensitive electronic component 106. In the exemplary embodiment, temperature-sensitive electronic component 106 and thermistor 110 are each coupled to a printed circuit board (not shown) and are physically coupled directly to one another to facilitate thermal conduction between temperature-sensitive electronic component 106 and thermistor 110. In alternative embodiments, thermistor 110 is spaced from and located proximate to temperature-sensitive electronic component 106 to facilitate efficient convective thermal exchange between temperature-sensitive electronic component 106 and thermistor 110. In the exemplary embodiment, housing 104 includes a plastic outer covering and a thermal insulation material between the plastic outer covering and the printed circuit board. The thickness of housing 104 facilitates capturing generated heat within housing 104 while preventing overheating of components within housing 104. In other embodiments, housing 104 includes no thermal insulation material. Alternatively, housing 104 is composed of any material that enables passive heating system 100 to function as described herein.

In the exemplary embodiment, heating circuit 108 is configured to generate heat energy when the temperature within housing 104 decreases and approaches the threshold temperature, such that the temperature of temperature-sensitive electronic component 106 is maintained above the threshold temperature. In the exemplary embodiment, thermistor 110 of heating circuit 108 is composed of a ceramic material having a temperature-dependent resistance. In alternative embodiments, thermistor 110 is composed of a polymer. In even further embodiments, thermistor 110 is composed of any material that enables thermistor 110 to function as described herein. Thermistor 110 has a varying resistance depending on the ambient environmental temperature surrounding thermistor 110. In particular, as will be described in greater detail with respect to FIG. 3, thermistor 110 is configured to change its resistance when the ambient temperature reaches a critical temperature of thermistor 110.

In the exemplary embodiment, when thermistor 110 is electrically coupled to power supply unit 102, a change in the ambient environmental temperature surrounding thermistor 110 effects a change in the total resistance of heating circuit 108. Accordingly, in the exemplary embodiment, a change in the ambient environmental temperature surrounding thermistor 110 causes a change in the total heat energy output by heating circuit 108. In particular, thermistor 110 is configured to cause heating circuit 108 to substantially increase generation of heat energy when a temperature of thermistor 110 is less than the critical temperature of thermistor 110.

As described in greater detail with respect to FIGS. 2-5, heating circuit 108 may have different configurations that enable the resistance change of thermistor 110 to result in heating circuit 108 generating heat energy. For example, in some embodiments of heating circuit 108, thermistor 110 itself generates heat energy by increasing in resistance when the temperature of thermistor 110 decreases and approaches the threshold temperature. In other embodiments of heating circuit 108, thermistor 110 does not substantially increase generated heat energy, but instead causes a change in current flow through heating circuit 108 which causes a separate resistor of heating circuit 108 to generate additional heat energy. In particular, in such embodiments, thermistor 110 decreases in resistance when the temperature of thermistor 110 decreases and approaches the threshold temperature. Accordingly, in such embodiments of heating circuit 108, the decrease in resistance of thermistor 110 causes an increase in current flowing through heating circuit 108, which in turn causes a separate resistor wired in series with thermistor 110 to generate heat energy.

In the exemplary embodiment, thermistor 110 is configured such that the critical temperature of thermistor 110 is less than the threshold temperature of temperature-sensitive electronic component 106. Accordingly, when the temperature of thermistor 110 is greater than the threshold temperature of temperature-sensitive electronic component 106 (i.e., also above the critical temperature of thermistor), heating circuit 108 generates substantially no heat energy. Therefore, in the exemplary embodiment, heating circuit 108 is incapable of over-heating temperature-sensitive electronic component 106. Furthermore, when the ambient temperature decreases and crosses the threshold temperature of temperature-sensitive electronic component 106, the temperature of thermistor 110 also drops below the critical temperature, causing heating circuit 108 to substantially increase generation of heat energy, and thereby maintain the temperature of temperature-sensitive electronic component 106 at a temperature above the threshold temperature of temperature-sensitive electronic component 106.

In some alternative embodiments, the critical temperature of thermistor 110 differs from the threshold temperature of temperature-sensitive electronic component 106 such that heating circuit 108 generates heat energy when a temperature of thermistor 110 is within a range of temperatures running from a temperature less than the threshold temperature to a temperature greater than the threshold temperature. In these embodiments, heating circuit 108 is configured to increase generation of heat energy as the temperature of thermistor 110 moves from the upper end of the temperature range to the lower end of the temperature range. In the exemplary embodiment, the minimum and the critical temperature of thermistor 110 are approximately equal to minus forty degrees Celsius (−40° C.). In alternative embodiments, the threshold temperature and the critical temperature are any temperatures that enable passive heating system 100 to function as described herein.

Figure 2:
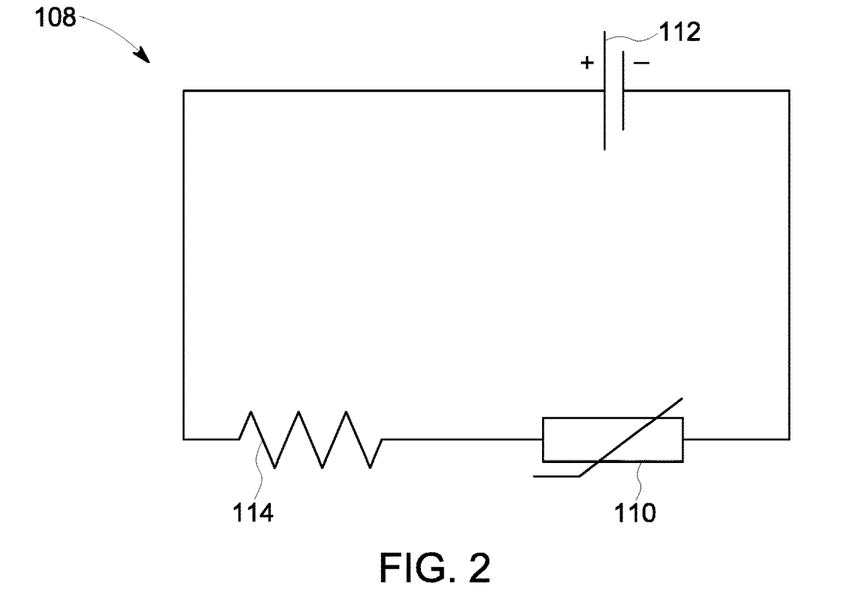
FIG. 2 is a circuit diagram of an exemplary heating circuit for use in the passive heating system of FIG. 1 including a positive temperature coefficient thermistor.
Figure 3:
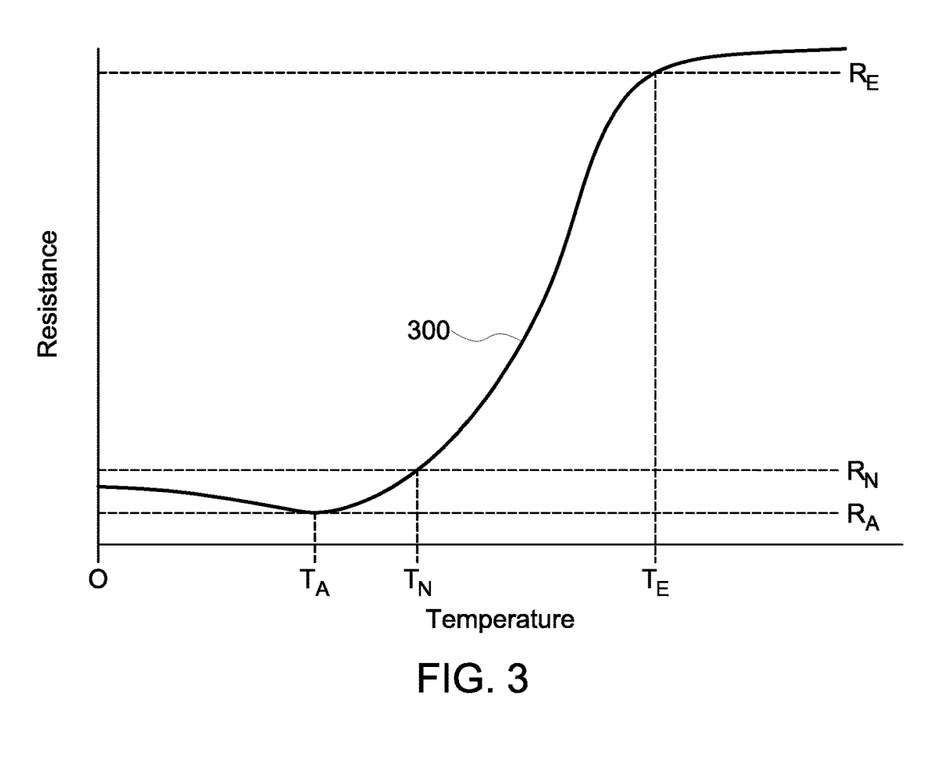
FIG. 3 is an exemplary temperature performance curve of the positive temperature coefficient thermistor shown in FIG. 2.

FIG. 2 is a circuit diagram of an exemplary heating circuit 108 for use in passive heating system 100 (shown in FIG. 1). FIG. 3 is an exemplary temperature performance curve 116 of a positive temperature coefficient thermistor 110 shown in FIG. 2. The x-axis of performance curve 116 represents the temperature of thermistor 110. The y-axis of performance curve 116 represents the resistance of thermistor 110. Referring to FIG. 2, in the exemplary embodiment, heating circuit 108 includes a voltage source 112. In the exemplary embodiment, voltage source 112 is power supply unit 102 (shown in FIG. 1). In alternative embodiments, voltage source 112 is an alternative power source that is powered by power supply unit 102. Heating circuit 108 further includes a resistor 114 and thermistor 110 electrically coupled in series with voltage source 112.

In the exemplary embodiment, voltage source 112 is a constant potential source that maintains a constant voltage supply independent of any changing resistive load on heating circuit 108. Thermistor 110 is a positive-temperature-coefficient (PTC) thermistor 110 configured to decrease its electrical resistance as the ambient temperature surrounding thermistor 110 decreases and increase its electrical resistance as the temperature around thermistor 110 increases. Resistor 114 is configured to maintain a substantially fixed resistance irrespective of changes in temperature. Accordingly, in the exemplary embodiment, when the temperature of PTC thermistor 110 is above the critical temperature (i.e., the temperature is greater than $T_E$ as shown in FIG. 3), the resistance of thermistor 110 is relatively high and current flowing through resistor 114 and thermistor 110 is comparatively low as a result of the relatively high resistance of thermistor 110. When the temperature of PTC thermistor 110 falls below the critical temperature, however the resistance of PTC thermistor 110 drops significantly. More specifically, referring to FIG. 3, when the temperature of PTC thermistor 110 drops below $T_E$, the resistance of thermistor 110 accordingly drops from $R_E$ Ohms to $R_N$ Ohms. With reference again to FIG. 2, because voltage source 112 is a constant potential source, in the exemplary embodiment, the decrease in resistance of PTC thermistor 110 to $R_N$ Ohms causes an increased current flow through resistor 114 and PTC thermistor 110.

The heat generated by resistor 114 is a function of the square of the current flow through resistor 114 multiplied by the resistance of resistor 114. Because the resistance of resistor 114 is fixed, the change in current flow through resistor 114, caused by the drop in resistance of PTC thermistor 110 to $R_N$ Ohms, causes resistor 114 to generate heat energy. Furthermore, as a result of the increased current through PTC thermistor 110, PTC thermistor 110 may also generate heat energy despite the drop in resistance. Accordingly, heat energy generated from resistor 114 is increased when the current flow through resistor 114 and thermistor 110 increases.

In the exemplary embodiment, resistor 114 has a much higher resistance than PTC thermistor 110 when the temperature of PTC thermistor 110 is below the critical temperature. Thus, in the exemplary embodiment, heat generated by heating circuit 108 is primarily generated by resistor 114. PTC thermistor 110 therefore serves primarily to regulate the electric current through heating circuit 108 and, in particular, the electric current through over resistor 114, depending on the temperature of PTC thermistor 110. In the exemplary embodiment, thermistor 110 is spaced from resistor 114 a sufficient distance to prevent heat generated by resistor 114 from causing an ambient temperature of thermistor 110 to rise above the general ambient temperature of housing 104. In certain embodiments, PTC thermistor 110 is spaced between 1 mm and 5 mm from resistor 114. More particularly, PTC thermistor 110 is spaced at least 0.5 mm from resistor 114. In alternative embodiments, PTC thermistor 110 is spaced any distance from resistor that enables passive heating system 100 to function as described herein. In further alternative embodiments, heating circuit 108 includes only a PTC thermistor 110 electrically coupled to voltage source 112. In such embodiments, heat generated by heating circuit 108 is generated solely by PTC thermistor 110.

Referring to FIG. 3, in performance curve 116, PTC thermistor 110 has a critical temperature in the range of $T_E$ to $T_N$. $T_E$ represents the temperature at which the resistance begins to noticeably change. $T_N$ represents the temperature at which, below $T_N$, the resistance of thermistor 110 is stabilized at a low value. In the exemplary embodiment, when the temperature of thermistor 110 is greater than $T_E$, the resistance of PTC thermistor 110 is at least greater than $R_E$ Ohms. In the exemplary embodiment, $R_E$ Ohms is at least 90 percent of the maximum possible resistance of PTC thermistor 110.

As the temperature of PTC thermistor 110 drops below $T_E$, resistance of thermistor 110 accordingly drops from $R_E$ Ohms to $R_N$ Ohms. In the exemplary embodiment, $R_N$ Ohms is less than 20 percent of the maximum possible resistance potential of PTC thermistor 110. More particularly, in the exemplary embodiment $R_N$ Ohms is less than 5 percent of the maximum possible resistance of PTC thermistor 110. As the temperature of PTC thermistor 110 drops below $T_N$, the resistance of thermistor 110 stabilizes between $R_N$ Ohms and $R_A$ Ohms. In the exemplary embodiment, $R_N$ is 2000 Ohms and $R_E$ is 100 Ohms. In alternative embodiments, PTC thermistor has any value $R_N$ and $R_E$ defining any range that enables passive heating system 100 to function as described herein.

The temperature difference between $T_E$ to $T_N$ impacts the rapidity with which heating circuit 108 is able to generate heat. In other words, the smaller the difference between $T_E$ to $T_N$, the more heating circuit 108 functions as a binary switch having a heating mode and an off mode. Conversely, PTC thermistors 110 having a larger difference between $T_E$ to $T_N$ allow for steady increases in heating. In the exemplary embodiment, $T_E$ is equal to −39° Celsius and $T_N$ is equal to −40° Celsius. That is, in the exemplary embodiment, where the threshold temperature of temperature-sensitive electronic component 106 is equal to −40° Celsius, $T_N$ is equal to the threshold temperature and $T_E$ is equal to one degree higher than the threshold temperature. In alternative embodiments, the difference between $T_E$ to $T_N$ may be between 0.01 degrees Celsius and 20 degrees Celsius. More particularly, the difference between $T_E$ to $T_N$ may range between 1 degree and 5 degrees. In even further embodiments, $T_E$ to $T_N$ defines any range that enables passive heating system 100 to function as described herein.

In the exemplary embodiment, the total heat generated by heating circuit 108, the relationship between changes in temperature to changes in heat generated, and the critical temperature of thermistor 110 are all determined by physical characteristics of heating circuit 108. For example, in alternative embodiments, heating circuit 108 includes multiple PTC thermistors 110 and/or resistors 114 wired in parallel with PTC thermistor 110 and resistor 114. Accordingly, in these embodiments, the ratio of a decrease in temperature to heat generated by heating circuit 108 is increased relative the exemplary embodiment. Further, the critical temperature of thermistor 110 is determined by the material composition of thermistor 110. Accordingly, thermistor 110 may be selected based on the desired critical temperature of thermistor 110 depending on the application. As a result, passive heating system 100 allows for thermal regulation of temperature-sensitive electronic components without requiring a controller or computer-executed software.

Figure 4:
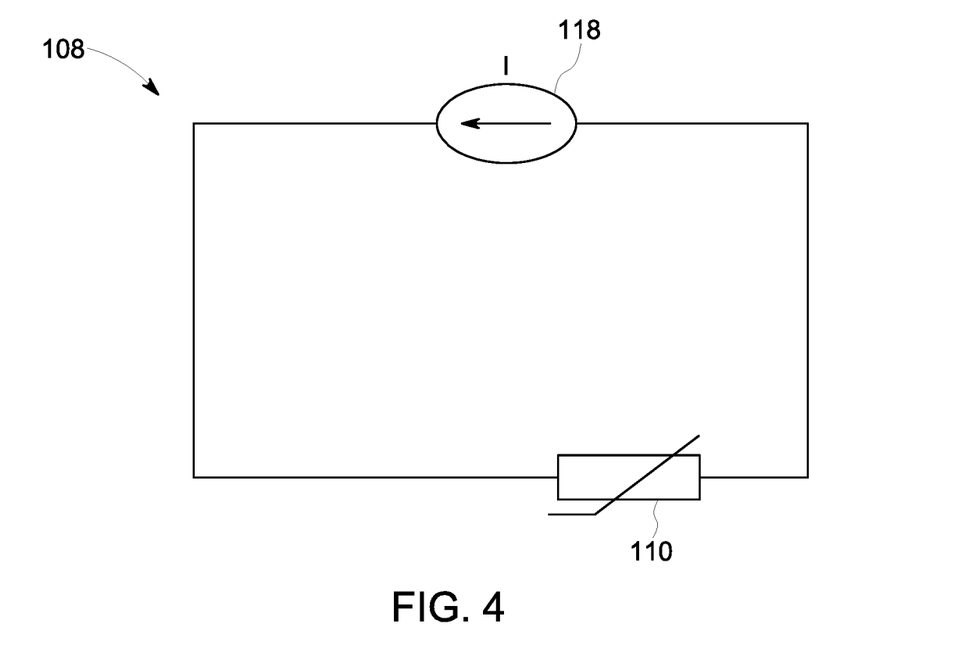
FIG. 4 is a circuit diagram of an alternative exemplary heating circuit for use in the passive heating system of FIG. 1 including a negative temperature coefficient thermistor.
Figure 5:
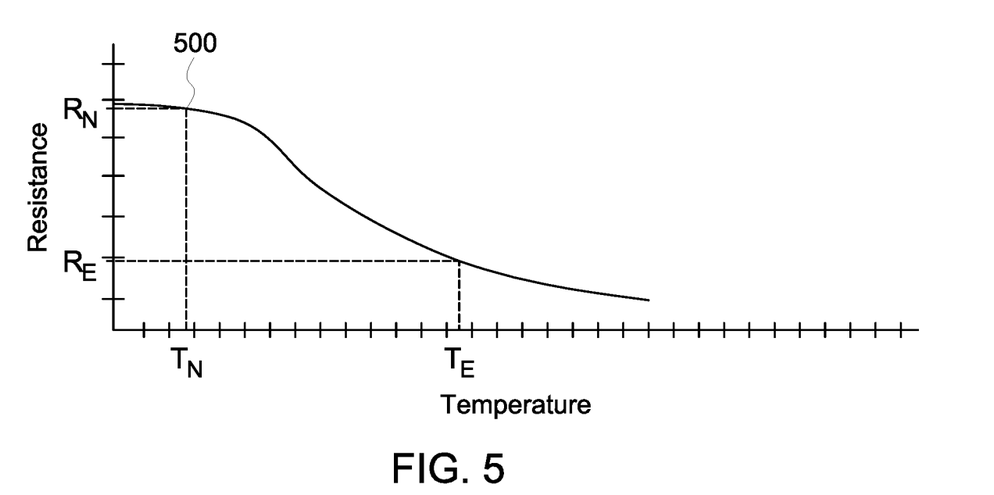
FIG. 5 is an exemplary temperature performance curve of the negative temperature coefficient thermistor shown in FIG. 4.

FIG. 4 is a circuit diagram of an exemplary alternative heating circuit 108 for use in the passive heating system 100 of FIG. 1 including a negative temperature coefficient (NTC) thermistor 110. FIG. 5 is an exemplary temperature performance curve 120 of NTC thermistor 110 shown in FIG. 4. The x-axis of performance curve 120 represents the temperature of thermistor 110. The y-axis of performance curve 120 represents the resistance of thermistor 110. In the exemplary embodiment, heating circuit 108 includes a current source 118 configured to provide a constant current to NTC thermistor 110 irrespective of varying resistance of NTC thermistor 110. In the exemplary embodiment, current source 118 is electrically coupled to power supply unit 102 (shown in FIG. 1).

Referring to FIG. 5, in the exemplary embodiment, NTC thermistor 110 is configured to decrease its resistance as the ambient temperature around thermistor 110 increases. Accordingly, in the exemplary embodiment, when the temperature of NTC thermistor 110 is above a critical temperature $T_E$, the resistance $R_E$ of thermistor 110 is relatively low. As the temperature of NTC thermistor 110 drops below the critical temperature $T_E$ of NTC thermistor 110, the resistance of thermistor 110 increases from $R_E$ Ohms to $R_N$ Ohms. Accordingly, in the exemplary performance curve, NTC thermistor 110 has a critical temperature in the range of $T_E$ to $T_N$, with $T_E$ representing the temperature at which the resistance begins to noticeably change and $T_N$ representing the temperature at which, below $T_N$, the resistance of thermistor 110 is stabilized at a high value.

In the exemplary embodiment, when the temperature of thermistor 110 is greater than $T_E$, the resistance of NTC thermistor 110 is less than $R_E$ Ohms. In the exemplary embodiment, $R_E$ Ohms is less than 10 percent of the maximum potential resistance of NTC thermistor 110. In the exemplary embodiment, $R_N$ Ohms is greater than 60 percent of the maximum potential resistance of NTC thermistor 110. More particularly, in the exemplary embodiment $R_N$ Ohms is greater than 80 percent of the maximum potential resistance of NTC thermistor 110.

In the exemplary embodiment, $T_E$ is equal to −39 degrees Celsius and $T_N$ is equal to −40 degrees Celsius. That is, in the exemplary embodiment, where the threshold temperature of the temperature-sensitive electronic component 106 is equal to −40 degrees Celsius, $T_N$ is equal to the threshold temperature and $T_E$ is equal to one degree higher than the threshold temperature. In alternative embodiments, the difference between $T_E$ to $T_N$ may be between 0.01 degrees Celsius and 20 degrees Celsius. More particularly, the difference between $T_E$ to $T_N$ may range between 1 degree and 5 degrees. In even further embodiments, $T_E$ to $T_N$ defines any range that enables passive heating system 100 to function as described herein.

Referring to FIG. 4, since current source 118 is a constant current source, the increase in resistance of NTC thermistor 110 from $R_E$ Ohms to $R_N$ Ohms causes a corresponding increase in heat generated by NTC thermistor 110. That is, since the heat generated by NTC thermistor 110 is a function of the square of the current over thermistor 110 multiplied by the resistance of thermistor 110, and since the current is maintained at a constant value by current source 118, increasing the resistance of NTC thermistor 110 increases the heat generated by heating circuit 108, and, more particularly, NTC thermistor 110.

Figure 6:
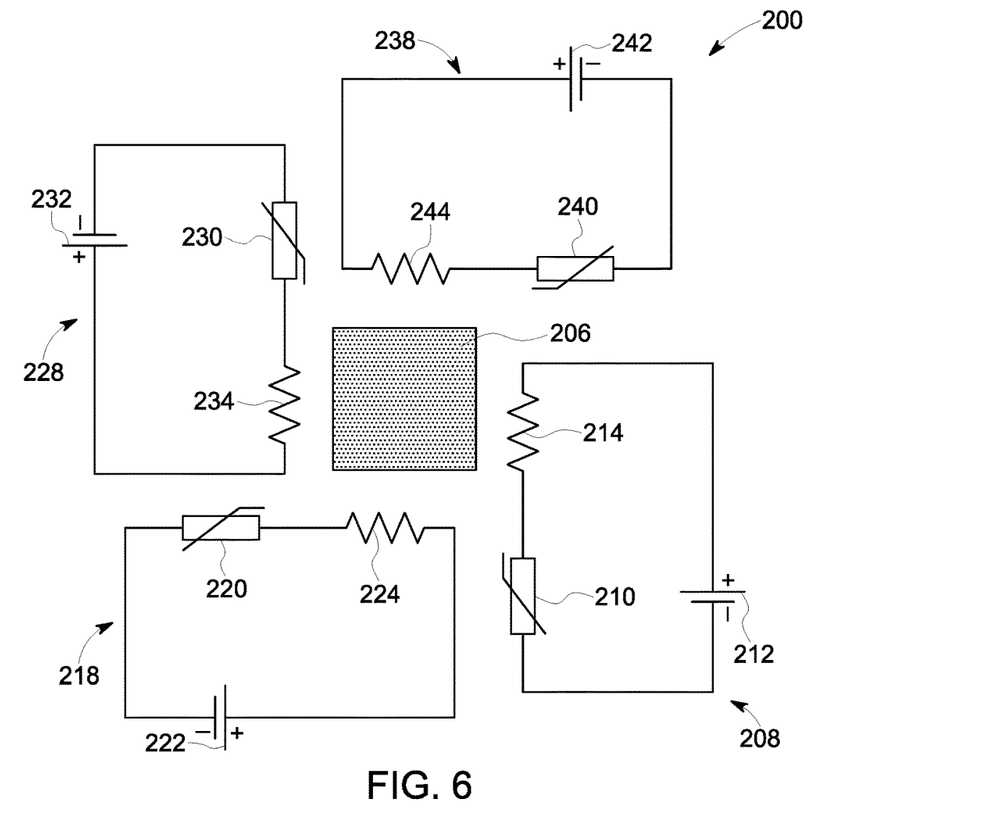
FIG. 6 is a schematic view of an exemplary passive heating system including a plurality of the exemplary heating circuits shown in FIG. 2.

FIG. 6 is a schematic view of an exemplary passive heating system 200 including a plurality of exemplary heating circuits 208, 218, 228, 238. In the exemplary embodiment, plurality of heating circuits 208, 218, 228, 238 are arranged around a temperature-sensitive electronic component 206. In particular, passive heating system 200 includes four heating circuits 208, 218, 228, 238. In alternative embodiments, passive heating system 200 includes any number of heating circuits that enables passive heating system 200 to function as described herein.

In the exemplary embodiment, each heating circuit 208, 218, 228, 238 includes a constant voltage source 212, 222, 232, 242, a PTC thermistor 210, 220, 230, 240, and a resistor 214, 224, 234, 244. In alternative embodiments, each heating circuit 208, 218, 228, 238 including a constant current heating circuit as described above. In such embodiments, each heating circuit 208, 218, 228, 238 includes an NTC thermistor. In even further embodiments, passive heating system 200 includes at least one constant current circuit having an NTC thermistor and at least one constant potential circuit having a PTC thermistor.

Resistors 214, 224, 234, 244 of each heating circuit 208, 218, 228, 238 are positioned adjacent temperature-sensitive electronic component 206. In the exemplary embodiment, resistors 214, 224, 234, 244 are each directly coupled to temperature-sensitive electronic component 206 to facilitate thermal conduction between resistors 214, 224, 234, 244 and temperature-sensitive electronic component 206. Furthermore, resistors 214, 224, 234, 244 are equidistantly spaced around temperature-sensitive electronic component 206 to provide for evenly distributed thermal conduction between resistors 214, 224, 234, 244 and temperature-sensitive electronic component 206. In the exemplary embodiment, thermistors 210, 220, 230, 240 are also directly coupled to temperature-sensitive electronic component 206 to facilitate thermal conduction between temperature-sensitive electronic component 206 and thermistors 210, 220, 230, 240. Coupling thermistors 210, 220, 230, 240 in thermal conduction with temperature-sensitive electronic component 206 ensures that the temperature of thermistors 210, 220, 230, 240 will be closely linked with the temperature of temperature-sensitive electronic component 206. In alternative embodiments, heating circuits 208, 218, 228, 238 are arranged about temperature-sensitive electronic component 206 in any manner that facilitates efficient heating of temperature-sensitive electronic component 206 when temperature-sensitive electronic component 206 approaches the threshold temperature. For example, in other embodiments, heating circuits 208, 218, 228, 238 are positioned a distance from temperature-sensitive electronic component 206 and are arranged to facilitate efficient convective thermal transfer between heating circuits 208, 218, 228, 238 and temperature-sensitive electronic component 206.

In the exemplary embodiment, each thermistor 210, 220, 230, 240, has the same critical temperature. In alternative embodiments, thermistors 210, 220, 230, 240, may have different critical temperatures from one another. For example, in alternative embodiments, critical temperatures of thermistors 210, 220, 230, 240, are staggered such that heating circuits 208, 218, 228, 238 each begin to generate heat at different times as the ambient environmental temperature drops. In this way, plurality of heating circuits 208, 218, 228, 238 may serve as backups for one another that generate heat only after temperature of the temperature-sensitive electronic component 206 continues to fall after other heating circuits 208, 218, 228, 238 have begun generating heat. In alternative embodiments, each heating circuit 208, 218, 228, 238 is electrically coupled to a single voltage source.

Figure 7:
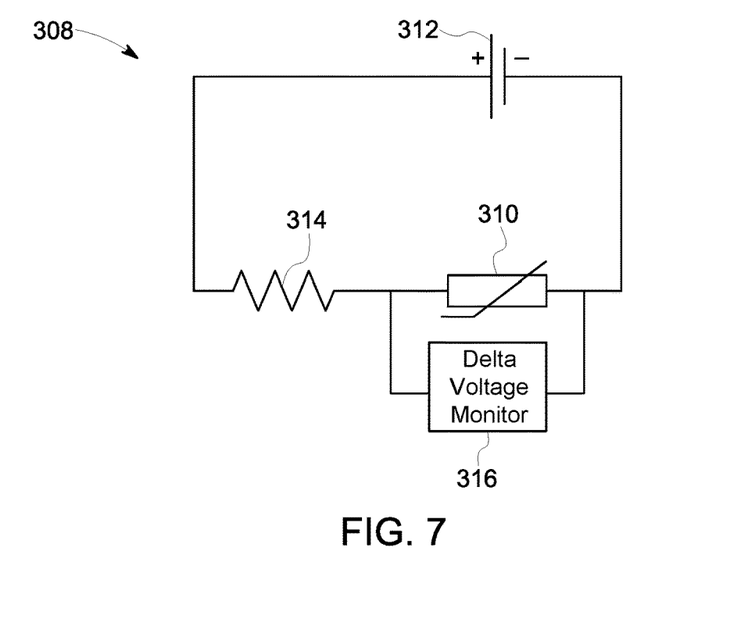
FIG. 7 is a circuit diagram of an alternative exemplary heating circuit for use in the passive heating system of FIG. 1 including a current monitor.

FIG. 7 is a schematic view of an alternative exemplary heating circuit 308 for use in passive heating system 100 of FIG. 1 including a current monitor 316. In alternative embodiments, heating circuit 308 is used in any passive heating system that enables heating circuit 308 to function as described herein. For example, in alternative embodiments, heating circuit 308 is used in a passive heating system 200 of FIG. 6. In the exemplary embodiment, current monitor 316 includes a standard fuse arranged to create an open circuit whenever the electrical current through current monitor 316 exceeds a material dependent threshold of the fuse. In alternative embodiments, current monitor 316 includes any current monitor 316 that enables heating circuit 308 to function as described herein.

In the exemplary embodiment, heating circuit 308 is substantially similar to heating circuit 108 described above with respect to FIG. 2 including voltage monitor 316 electrically connected in parallel with a PTC thermistor 310 and configured to measure the voltage change through PTC thermistor 310. That is, in the exemplary embodiment, heating circuit 308 includes PTC thermistor 310, a voltage source 312 and a resistor 314 electrically connected in series. In alternative embodiments, heating circuit 308 is substantially similar to heating circuit 108 described above with respect to FIG. 4. That is, in alternative embodiments, heating circuit 308 includes an NTC thermistor 110 and a current source 118 (shown in FIG. 4). In the exemplary embodiment, current monitor 316 is arranged to sense the current through PTC thermistor 310.

In the exemplary embodiment, current monitor 316 is operable to sense a flow of current through PTC thermistor 310 and generate an electrical response based on whether PTC thermistor 310 is in an open circuit state or a short circuit state. For example, PTC thermistor 310 may be susceptible to degradation and failure during use of heating circuit 308. Failure of PTC thermistor 310 can result in PTC thermistor 310 having a near zero electrical impedance irrespective of a surrounding temperature (e.g., a short circuit failure). During a short-circuit failure of heating circuit 308, thermistor will provide near zero resistance, thereby causing resistor 314 to generate heat irrespective of the ambient temperature. Accordingly, if left uncorrected, a short circuit failure could lead to overheating of temperature-sensitive electronic component 106 (shown in FIG. 1). In the exemplary embodiment, when delta voltage monitor 316 detects a voltage drop through PTC thermistor 310 of substantially near zero, an open circuit is created through the current monitor 316 to stop the flow of current through heating circuit 308. Ceasing the flow of current through heating circuit 308 prevents overheating of temperature-sensitive electronic component 106 (shown in FIG. 1). In alternative embodiments, delta voltage monitor 316 includes an exterior indicator (not shown) to indicate that delta voltage monitor 316 has created an open circuit. Accordingly, in alternative embodiments, the fact that heating circuit 308 has a failed PTC thermistor 310 may be quickly identified during routine checks and replaced with a properly functioning heating circuit 308 or PTC thermistor 310.

In the exemplary embodiment, delta voltage monitor 316 further includes an open circuit indicator to indicate a failure of PTC thermistor 310 resulting in an open circuit. For example, degradation of PTC thermistor 310 can also cause PTC thermistor 310 to create an open circuit, thereby preventing the flow of current through heating circuit 308 and preventing resistor 314 from generating heat irrespective of the ambient temperature. Delta voltage monitor 316 indicates an open circuit whenever delta voltage monitor 316 senses a voltage drop below the material threshold of delta voltage monitor 316. Accordingly, heating circuit 308 with a PTC thermistor 310 having an open circuit failure may be identified during routine checks and replaced with a properly functioning heating circuit 308 or PTC thermistor 310.

In alternative embodiments, similar to passive heating system 200 shown in FIG. 6, passive heating system 100 includes at least one additional heating circuit (not shown) substantially identical to heating circuit 308. For example, in such embodiments, the at least one redundant heating circuit (not shown) continues to provide heat to temperature-sensitive electronic component 106 (shown in FIG. 1) after either delta voltage monitor 316 creates an open circuit due to a short circuit through PTC thermistor 310 or delta voltage monitor 316 detects an open circuit through PTC thermistor 310. In even further alternative embodiments, delta voltage monitor 316 is connected to redundant heating circuits (not shown) such that detection of an open circuit or short circuit through PTC thermistor 310 triggers current flow through the redundant heating circuit (not shown) to enable the redundant heating circuit to provide heat when heating circuit 308 is in a state of failure and to not provide heat when heating circuit 308 is not in a state of failure.

Figure 8:
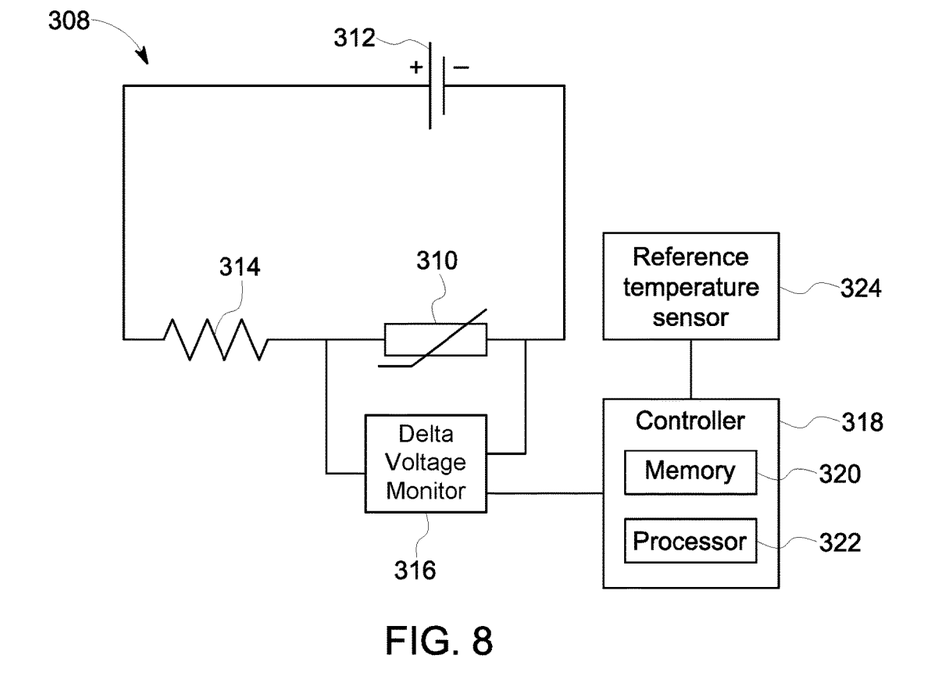
FIG. 8 is a schematic view of an alternative exemplary heating circuit for use in the passive heating system of FIG. 1 including a current monitor and a controller.

FIG. 8 is a schematic view of an alternative exemplary heating circuit 308 for use in passive heating system 100 of FIG. 1 including current monitor 316 and a controller 318.

In the exemplary embodiment, delta voltage monitor 316 is communicatively coupled to controller 318 such that delta voltage monitor 316 relays the sensed voltage drop to controller 318. In the exemplary embodiment, controller 318 includes a memory device 320 and a processor 322 coupled to memory device 320. Processor 322 may include one or more processing units, such as, without limitation, a multi-core configuration. Processor 322 is any type of processor that permits controller 318 to operate as described herein. In some embodiments, executable instructions are stored in memory device 320. Controller 318 is configurable to perform one or more operations described herein by programming processor 322. For example, processor 322 may be programmed by encoding an operation as one or more executable instructions and providing the executable instructions in memory device 320. In the exemplary embodiment, memory device 320 is one or more devices that enable storage and retrieval of information such as executable instructions or other data. Memory device 320 may include one or more computer readable media, such as, without limitation, random access memory (RAM), dynamic RAM, static RAM, a solid-state disk, a hard disk, read-only memory (ROM), erasable programmable ROM, electrically erasable programmable ROM, or non-volatile RAM memory. The above memory types are exemplary only, and are thus not limiting as to the types of memory usable for storage of a computer program.

Memory device 320 may be configured to store any type of data, including, without limitation, voltage drop parameters relayed by delta voltage monitor 316. In some embodiments, processor 322 removes or "purges" data from memory device 320 based on the age of the data. For example, processor 322 may overwrite previously recorded and stored data associated with a subsequent time or event. In addition, or alternatively, processor 322 may remove data that exceeds a predetermined time interval.

In the exemplary embodiment, controller 318 determines and tracks current through PTC thermistor 310 over time based on voltage drop sensed by delta voltage monitor. Further, in the exemplary embodiment, a reference temperature sensor 324 is communicatively coupled to controller 318. Reference temperature sensor 324 is configured to relay a sensed temperature to controller 318. Controller 318 may then determine whether PTC thermistor 310 is operating within normal operating parameters of PTC thermistor 310. For example, controller 318 compares the sensed temperature from the reference temperature sensor 324 to the determined current based on the voltage drop sensed by delta voltage monitor 316 to determine whether current through PTC thermistor 310 matches the expected current based on the voltage supply and the ambient temperature. Accordingly, controller 318 may determine if PTC thermistor 310 experiences a parameter drift effect in which the critical temperature of PTC thermistor 310 is different from the expected critical temperature of PTC thermistor 310. In alternative embodiments, controller 318 is further connected to an external display to relay a warning if controller 318 determines that PTC thermistor 310 is experiencing parameter drift. In even further alternative embodiments, controller 318 is configured to control heating circuit 308 such that controller 318 may alter the flow of current within heating circuit 308 to compensate for the determined parameter drift of PTC thermistor 310.

Figure 9:
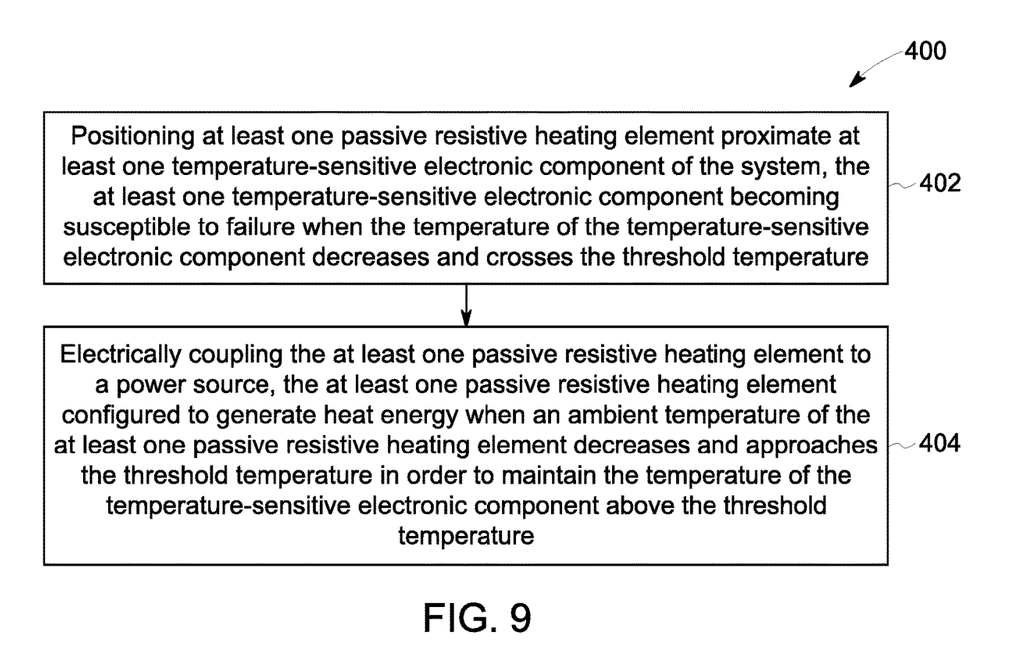
FIG. 9 is a flowchart of an exemplary method of retrofitting a system for operation below a threshold temperature.

FIG. 9 is a flowchart of an exemplary method 400 of retrofitting a system 100, shown in FIG. 1, for operation below a threshold temperature. Method 400 includes positioning 402 at least one passive resistive heating element (e.g., heating circuit 108, shown in FIG. 1) proximate at least one temperature-sensitive electronic component 106, shown in FIG. 1, of system 100, the at least one temperature-sensitive electronic component 106 becoming susceptible to failure when the temperature of the temperature-sensitive electronic component 106 decreases and crosses the threshold temperature. Method 400 also includes electrically coupling 404 the at least one passive resistive heating element 108 to power supply 102, shown in FIG. 1, the at least one passive resistive heating element 108 configured to generate heat energy when an ambient temperature of the at least one passive resistive heating element 108 decreases and approaches the threshold temperature in order to maintain the temperature of the temperature-sensitive electronic component 106 above the threshold temperature.

Exemplary technical effects of the passive heating system described herein include, for example: (a) increasing reliability of temperature-sensitive electronic components; (b) increasing lifespan of temperature-sensitive electronic components operating in extreme temperature environments; (c) reducing complexity in temperature-sensitive electronic component heating systems; (d) increasing ability to target thermal conduction on individual electronic components of electronic systems.

Exemplary embodiments of a passive heating system and related components are described above in detail. The system is not limited to the specific embodiments described herein, but rather, components of systems and/or steps of the methods may be utilized independently and separately from other components and/or steps described herein. For example, the configuration of components described herein may also be used in combination with other processes, and is not limited to practice with the systems and related methods as described herein. Rather, the exemplary embodiment can be implemented and utilized in connection with many applications where heating is desired.

Although specific features of various embodiments of the present disclosure may be shown in some drawings and not in others, this is for convenience only. In accordance with the principles of the present disclosure, any feature of a drawing may be referenced and/or claimed in combination with any feature of any other drawing.

This written description uses examples to disclose the embodiments of the present disclosure, including the best mode, and also to enable any person skilled in the art to practice the disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system configured for operation below a threshold temperature, said system comprising:
   a power supply;
   a housing;
   a temperature-sensitive electronic component enclosed within said housing and electrically connected to said power supply, wherein said temperature-sensitive electronic component becomes susceptible to failure when the temperature of said temperature-sensitive electronic component decreases and crosses the threshold temperature; and
   a heating circuit at least partially enclosed within said housing and comprising a temperature-dependent positive-temperature-coefficient (PTC) thermistor having a resistance that decreased below a critical temperature, and a heat-generating resistor in electrical series with the PTC thermistor, said heating circuit electrically connected to said power supply and configured to generate heat energy, by way of the heat-generating resistor, within said housing when the temperature within said housing decreases and approaches the threshold temperature in order to maintain the temperature of said temperature-sensitive electronic component above the threshold temperature.

2. The system of claim 1, wherein said heating circuit is configured to generate heat energy when an ambient temperature of said PTC thermistor is less than the threshold temperature.

3. The system of claim 1, wherein said heating circuit is configured to cease generating heat energy when an ambient temperature of said PTC thermistor is greater than the threshold temperature.

4. The system of claim 1, wherein said heating circuit is configured to generate heat energy when an ambient temperature of said temperature-dependent resistor falls within a range of temperatures including the threshold temperature.

5. The system of claim 1, wherein the threshold temperature is less than or equal to minus forty degrees Celsius.

6. The system of claim 1, wherein said temperature-dependent resistor comprises a negative-temperature-coefficient (NTC) thermistor having a resistance that increases below a critical temperature.

7. The system of claim 6, wherein the increased resistance of said NTC thermistor below the critical temperature corresponds to an increase in heat energy generated by said heating circuit.

8. The system of claim 1, wherein said PTC thermistor includes a resistance that decreases below a critical temperature.

9. The system of claim 8, wherein the decreased resistance of said PTC thermistor below the critical temperature corresponds to an increase in heat energy generated by said heating circuit.

10. The system of claim 1, wherein said system enables thermal regulation of said temperature-sensitive electronic component without requiring a controller or computer-executed software.

11. A system configured for operation below a threshold temperature, said system comprising:
    at least one temperature-sensitive electronic component, said at least one temperature-sensitive electronic component becoming susceptible to failure when the temperature of said at least one temperature-sensitive electronic component decreases and crosses the threshold temperature;
    a temperature-dependent positive-temperature-coefficient (PTC) thermistor having a resistance that decreased below a critical temperature; and
    at least one passive resistive heating element in electrical series with the PTC thermistor and configured to generate heat energy when an ambient temperature of said PTC thermistor decreases and approaches the threshold temperature in order to maintain the temperature of said at least one temperature-sensitive electronic component above the threshold temperature.

12. The system of claim 11, wherein said at least one passive resistive heating element comprises a plurality of passive resistive heating elements.

13. The system of claim 11, wherein said at least one passive resistive heating element is configured to cease generating heat energy when the ambient temperature of said the PTC thermistor is greater than the threshold temperature.

14. The system of claim 11, wherein said at least one passive resistive heating element is configured to generate heat energy when the ambient temperature of said the PTC thermistor falls within a range of temperatures including the threshold temperature.

15. The system of claim 11, wherein the threshold temperature is less than or equal to minus forty degrees Celsius.

16. The system of claim 11, further comprising a negative-temperature-coefficient (NTC) thermistor having a resistance that increases below a critical temperature.

17. The system of claim 16, wherein the increased resistance of said NTC thermistor below the critical temperature corresponds to an increase in heat energy generated by said at least one passive resistive heating element.

18. The system of claim 11, wherein the decreased resistance of said PTC thermistor below the critical temperature corresponds to an increase in heat energy generated by said at least one passive resistive heating element.

19. A heating circuit for heating a temperature-sensitive electronic component, the temperature-sensitive electronic component becoming susceptible to failure when the temperature of the temperature-sensitive electronic component decreases and crosses a threshold temperature, said heating circuit comprising:
- a power source;
- a temperature-dependent positive-temperature-coefficient (PTC) thermistor electrically connected to said power source, said PTC thermistor configured to decrease in resistance when the temperature surrounding said PTC thermistor temperature dependent resistor decreases and approaches the threshold temperature;
- a resistive heating element electrically connected in series with said PTC thermistor and configured to generate heat energy when said PTC thermistor decreases in resistance in order to maintain the temperature of said temperature-sensitive electronic component above the threshold temperature; and
- a delta voltage monitor configured to sense a voltage drop through said PTC thermistor and indicate, based on the sensed voltage drop, at least one of a sensed open-circuit failure and a short circuit failure.

* * * * *

UNITED STATES PATENT AND TRADEMARK OFFICE
CERTIFICATE OF CORRECTION

| | | |
|---|---|---|
| PATENT NO. | : 11,224,098 B2 | |
| APPLICATION NO. | : 16/177996 | |
| DATED | : January 11, 2022 | |
| INVENTOR(S) | : Hendrik Pieter Jacobus de Bock et al. | |

It is certified that error appears in the above-identified patent and that said Letters Patent is hereby corrected as shown below:

In the Claims

Column 16, Line 12:
"…said PTC thermistor configured to decrease in resistance when the temperature surrounding said PTC thermistor temperature dependent resistor decreases and approaches the threshold temperature;…"

Should read:
"… said PTC thermistor configured to decrease in resistance when the temperature surrounding said PTC thermistor decreases and approaches the threshold temperature;…"

Signed and Sealed this
Tenth Day of May, 2022

*Katherine Kelly Vidal*

Katherine Kelly Vidal
*Director of the United States Patent and Trademark Office*